United States Patent [19]

Harari et al.

[11] Patent Number: 5,315,541
[45] Date of Patent: May 24, 1994

[54] SEGMENTED COLUMN MEMORY ARRAY

[75] Inventors: Eliyahou Harari, Los Gatos; Sanjay Mehrotra, Milpitas, both of Calif.

[73] Assignee: SunDisk Corporation, Del.

[21] Appl. No.: 919,715

[22] Filed: Jul. 24, 1992

[51] Int. Cl.$^5$ .............................................. G11C 5/06
[52] U.S. Cl. ...................... 365/63; 365/51
[58] Field of Search .................. 365/63, 51, 185, 182

[56] References Cited

U.S. PATENT DOCUMENTS

| | | | |
|---|---|---|---|
| 5,111,428 | 5/1992 | Lians | 365/51 |
| 5,127,739 | 7/1992 | Duvvury | 365/205 |
| 5,204,835 | 4/1993 | Eitan | 365/185 |

OTHER PUBLICATIONS

M. Inoue et al., "A 16 Mb DRAM With An Open Bit-Line Architecture", ISSCC Solid-State Circuits Conference, San Francisco, Feb. 1988, pp. 246-248.

M. Okada et al., "16 Mb ROM Design using Bank Select Architecture", IEEE Symposium on VLSI Circuits, Tokyo, Aug. 1988, pp. 85-86.

B. Eitan, et al., "Alternate Metal Virtual Ground (AMG)-A New Scaling Concept for Very High-Density EPROM's", IEEE Electron Device Letters, Aug. 1991, pp. 450-452.

W. Kammerer, et al., "A New Virtual Ground Array Architecture for Very High Speed, High Density EPROMS", IEEE Symposium on VLSI Circuits OISO, May 1991, pp. 83-84.

Primary Examiner—Eugene R. LaRoche
Assistant Examiner—A. Zarabian
Attorney, Agent, or Firm—Majestic, Parsons, Siebert & Hsue

[57] ABSTRACT

In an array of solid-state memory cells organized into rows and segmented columns and addressable by wordlines and bit lines, a memory cell within a segmented column is addressable by segment-select transistors which selectively connect the memory cell's pair of bit lines via conductive lines running parallel to the columns to a column decode circuit. The disposition of the segment-select transistors and the conductive lines relative to the segmented columns enables one segment-select transistor to fit in every two or more columns. In one embodiment, the segment-select transistors have double the pitch of the columns while the conductive lines have the same pitch of the columns. In another embodiment, the segment-select transistor have four times the pitch of the columns while the conductive lines have double the pitch of the columns. This enables the use of larger size segment-select transistors which are necessary for passing higher currents in devices such as EPROM or flash EEPROM. Column segmentation effectively isolates defects to individual segments and reduces the capacitance in the source and drain of an address memory cell.

11 Claims, 7 Drawing Sheets

| (A) COLUMN | 1 | | 2 | | 3 | | 4 | | 5 | |
|---|---|---|---|---|---|---|---|---|---|---|
| (B) Y ADDR FOR COLUMN = [Y(r)...Y(0)] | (...0001) | | (...0010) | | (...0011) | | (...0100) | | (...0101) | |
| (C) SOURCE/DRAIN | S | D | S | D | S | D | S | D | S | D |
| (D) CONDUCTOR STRIP | $M_1$ | $M_2$ | $M_2$ | $M_1$ | $M_1$ | $M_2$ | $M_2$ | $M_3$ | $M_3$ | $M_4$ |
| (E) L/R (HIGH) | $L_2$ | $L_1$ | $L_1$ | $R_2$ | $R_2$ | $R_1$ | $R_1$ | $L_2$ | $L_2$ | $L_1$ |
| (F) M-NODE A ENABLE (HIGH) | $ME_1$ | | | $ME_1$ | $ME_1$ | | | $ME_3$ | $ME_3$ | |
| (G) M-NODE B ENABLE (HIGH) | | $ME_2$ | $ME_2$ | | | $ME_2$ | $ME_2$ | | | $ME_4$ |

FIG. 8

| Y(1) | Y(2) | $L_A$ | $R_A$ | $L_B$ | $R_B$ |
|---|---|---|---|---|---|
| 0 | 0 | | 1 | 1 | |
| 0 | 1 | 1 | | | 1 |
| 1 | 0 | 1 | | | 1 |
| 1 | 1 | | 1 | | 1 |

FIG. 9

SEGMENTED COLUMN MEMORY ARRAY

BACKGROUND OF THE INVENTION

This invention relates to semiconductor integrated circuit (IC) devices, and particularly to memory arrays.

Solid state IC memory devices are typically formed by a two-dimensional array of cells. Each cell is a transistor that has at least a source, a drain and a control gate. The conduction of the current from the drain to the source depends on the voltage applied to the control gate. A "0" state or a "1" state is possible depending on whether the transistor is conducting or nonconducting. In this way, the transistor functions as a binary memory device.

In electrically programmable read only memory (EPROM, each of the transistors also has a floating gate for charge storage. Electrically erasable programmable read only memory (EEPROM) and Flash EEPROM devices may also have an erase gate in addition to the control gate. During programming, voltages applied to the control gate and drain enable hot electrons to be injected into the floating gate. During erasing, application of voltage at the erase gate enables electrons to be removed from the floating gate. At any time the balance of charge trapped in the floating gate determines the conduction threshold level of the transistor. In this way two or more conduction states are programmable or erasable at each cell. Since the programmed charge tends to be retained at the floating gate, EPROM, EEPROM and Flash EEPROM devices are "non-volatile" memories.

In a two-dimensional array the transistors forming the cells are arranged in rows and columns. An X-Y addressing system is effected by a series of word lines parallel to the rows and a series of bit lines parallel to the columns. A word line connects the gates of all transistors in one row. A bit line connects to either the sources or drains of all transistor in one column.

Two common bit-line arrangements are employed. In one type of arrangement the sources of all the transistors in the array are grounded. In each column, only the drains of all the transistors are tied to a bit line. In another type of arrangement known as a "virtual ground" system, the transistors along each row are daisy-chained together by their sources and drains. In each column of transistors, there are two bit lines. One of the bit lines is a source line that ties all the sources together. The other bit line is a drain line that ties all the drains together. The source line and drain line of a column are respectively also the drain line of the column to the left and the source line of the column to the right. In this way the need for a dedicated source line per column is eliminated. Any memory cell in the array can be programmed or read by application of appropriate voltages to the word line and the bit lines connected to it. In particular, the state of an addressed memory cell can be determined by sensing the current flowing through its source and drain by means of the bit lines connected to them. To reduce the area taken up by the source and drain bit lines they can be implemented as buried diffusion bit lines.

As larger and denser memory arrays are fabricated, several design considerations become more acute. The first problem is that series resistance of the source or drain buried diffusion bit line increases with the number of cells in a column. The buried diffusion bit lines are usually doped silicon diffusions and typically have a resistance of about 50Ω per cell. For a column with 1024 cells, this can amount to a differential of 50 KΩ resistance along a bit line.

A similar problem exists with the capacitance of the bit line which also increases with the number of cells in the column. The increase in resistance and capacitance results in a larger RC time constant for the sensing circuit and therefore a slower read cycle. Furthermore, the increase in bit line capacitance results in slower precharge (in cases where the design may require columns to be precharged before read) and higher power spike to charge/discharge bit lines during read.

One solution to reducing bit line series resistance is to parallel the buried diffusion bit lines with lower resistivity metal lines. Typically, aluminum strips are overlaid on the bit lines but generally insulated from them by a dielectric layer in between. A series of metal contact (vias) at intervals along a buried diffusion bit line establish contacts with a corresponding metal strip. The intervals may be as short as 1 contact every 2 cells in high speed static RAM's, dynamic RAM's, ROM, EPROM, EEPROM or flash EEPROM.

While paralleling with metal lines assists in reducing bit-line resistance, metallization and contacts introduce problems of their own. In high density integration, there is increasing danger of shorts between metal strips due to their narrow spacing and imperfect contacts which can adversely affect performance. The current state of technology limits the pitch (line width plus spacing) of the metal lines to be about 1.5 μm.

It is known that one way of controlling bit line series resistance and capacitance is to break up the columns and therefore the bit lines into shorter segments. One example is described in a conference paper entitled "A 16 Mb DRAM With An Open Bit-Line Architecture", by M. Inoue et al, published in ISSCC, Feb. 19, 1988. The paper demonstrates a 16 Mb DRAM array segmented into segments of 256 word lines each. A dedicated sense amplifier is connected to each segmented bit line at one end and to a global bit line at the other end via a select transistor. The authors show that in conventional open bit line architectures, the total packing density of a 16 MB DRAM cannot be improved since the scaling of the cell size is limited by the layout pitch of the sense amplifiers. To overcome this problem, the authors arrange the sense amplifiers for adjacent bit lines alternately at the top and bottom of the segment. This allows each sense amplifier to occupy double the spacing of the columns. However, the architecture has the disadvantage of using multiple sense amplifiers; one set is used for every segment. The pitches of the metal lines and the select transistors remain the same as that of the bit lines.

In another conference paper entitled, "16 Mb ROM Design using Bank Select Architecture", by M. Okada et al, published in IEEE Symposium on VLSI Circuits, Tokyo, August 1988 p. 85, a segmented array is also employed to reduce bit line series resistance. The ROM is divided into 256 banks. Each bank is essentially a segmented column consisting of 16 word lines. Only one set of sense amplifiers is used for the whole array, and it is selectively switched onto even or odd columns by means of aluminum lines. The pair of segmented bit lines in each column are connectable to a pair of aluminum lines by bank-select transistors at all four ends, at the top and bottom of the segment. The aluminum lines run zigzag in the column direction between even and odd adjacent columns, and alternate in the middle of each segment. This architecture is such that the pitch of the aluminum lines is double that of the bit lines. This allows the aluminum lines to be further apart, thereby reducing the possibility of shorts. However, the disadvantage is that the pitch of the select transistors remains the same as that of the bit line and therefore limits the ultimate size and therefore the conductance of the select transistors. In addition, the bit line capacitance is not optimally reduced because the bank selection is such that when a column is selected, its source line and drain line are respectively shorted with the source line of the left adjacent column and the drain line of the right adjacent column. The selected bit lines are therefore coupled to the capacitance of other bit lines that are not selected.

The aforementioned architectures while suitable for mask programmed ROM or DRAM are not applicable to programmable memories such as EPROM or Flash EEPROM devices. These devices are electrically programmable and for programming require a much higher drain-source current (about one or two orders of magnitude higher) than that during reading. In a segmented architecture, the select transistors used must be capable of selectively applying the higher programming current involved. To do so the size of the select transistors must be large enough to limit their internal resistance. Prior art architectures restrict each select transistor to fit within the pitch of a column, which limits the size of the select transistors without unduly increasing the separation between adjacent segments.

SUMMARY OF THE INVENTION

It is therefore an object of the present invention to provide a memory device having segmented arrays without the above-mentioned disadvantages.

It is another object of the invention to provide a memory array with minimized bit-line resistance.

It is another object of the invention to provide a memory array with minimized bit-line capacitance.

It is another object of the invention to provide minimized word-line resistance and capacitance.

It is yet another object of the invention to provide good isolation from defects, bit-line to bit-line leakage and program disturb effects.

It is another object of the invention to reduce the number of contacts a bit line makes with a parallel metal line, thereby increasing manufacturing yields.

It is another object of the invention to increase the pitch of the metal lines in the array, thereby increasing manufacturing yields.

It is another object of the invention to have high density high speed EPROM, EEPROM or Flash EEPROM devices.

In accordance with the invention, a two-dimensional array of memory cells arranged in rows and columns is partitioned into a plurality of segmented arrays along the column direction. In this way, the bit line connecting to all the sources or drains of transistors in a column is also segmented.

Segmentation can significantly reduce bit-line resistance and capacitance, resulting in faster access time, among other things. It also isolates defects to the segments in which they are found, without the need to retire a much larger area if not the whole array.

According to one embodiment of the invention, segment-select transistors are connected to every segmented bit lines alternately from the top and the bottom of a segmented array. Each segment-select transistor connects a segmented buried diffusion bit line to an overlying conductive strip or metal line via a metal contact in between two segmented arrays. Each metal line parallels a corresponding bit line but is otherwise insulated from it. Each metal contact point in between two segmented arrays is shared by the in-line bit lines from adjacent segment arrays connectable to it via segment-select transistors.

This embodiment allows the segment-select transistors to be larger since they have twice the pitch of the bit lines. This makes segmentation of programmable memory arrays such as EPROM, EEPROM and Flash EEPROM possible. It also allows the metal contacts to be larger and fewer by one half since they also have twice the pitch of the bit lines, and allows them to be formed more easily since they are located outside the array regions between the two segment-select transistors which select either the segment immediately above or the segment immediately below the contact.

According to an alternative embodiment of the invention, the conductive strips or metal lines have double the pitch of the bit lines, such that each metal line is overlaid on two bit lines. A metal contact made with each metal line is located in line with but not connected to every four bit lines in between segmented arrays. Two segment-select transistors selectively connect each metal contact to the left or right bit line thereof. The left or right bit lines extend across adjacent segmented arrays immediately above and below the segment-select transistor. This configuration is repeated in between segments at alternate segments. Another similar set of metal contacts and segment-select transistors is located at the other alternate segments but offset by one bit line.

The alternative embodiment allows the segment-select transistors to have even larger size since their pitch is four times that of the bit lines. Similarly, the metal contacts have a pitch four times that of the bit lines. The number of contacts is reduced by three quarters. Also the double pitch of the metal line allows wider metal lines and consequently less problem with short or open circuits.

Additional objects, features and advantages of the present invention will become apparent from the following description of the preferred embodiments thereof, which description should be taken in conjunction with the accompanying drawings.

DETAILED DESCRIPTION OF THE PREFERRED EMBODIMENTS

Figure 1:
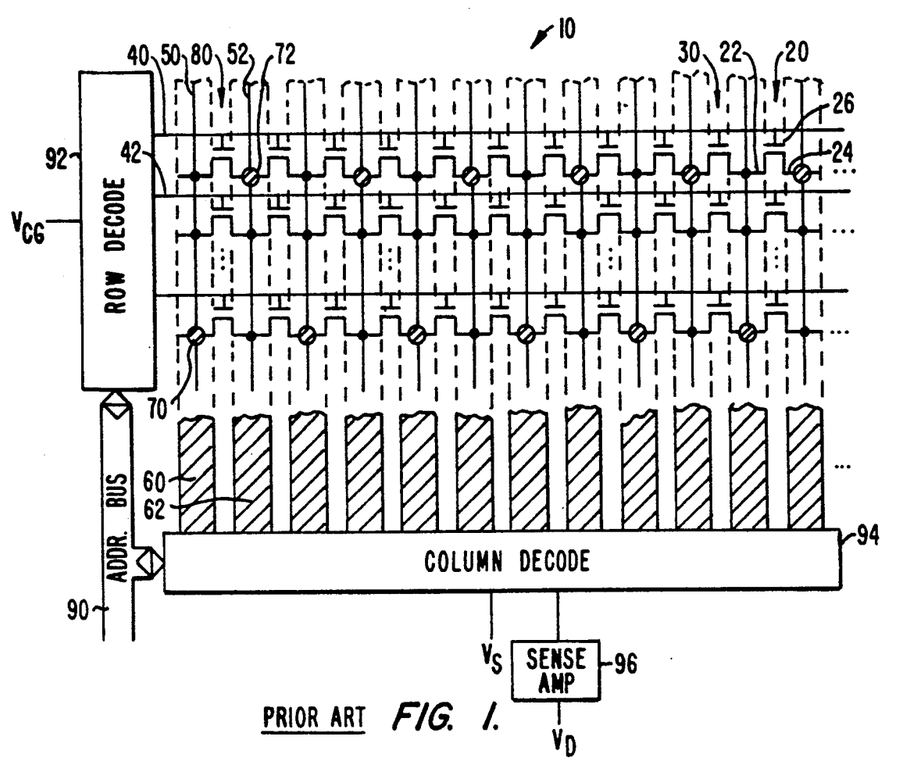
FIG. 1 is a schematic illustration of the architecture of a conventional virtual ground EPROM memory device.

FIG. 1 is a schematic illustration of an architecture of a conventional memory device. A two-dimensional array of memory cells 10 is formed by arranging transistors into rows and columns. A transistor 20 in the array typically comprises a source 22, a drain 24 and a control gate 26. FIG. 1 illustrates a memory array with a "virtual ground" architecture in which the transistors along each row are daisy-chained together by their sources and drains. Thus the drain of transistor 30 is connected to the source of transistor 20 on the right, and so on. An X-Y addressing system is effected by a set of word lines parallel to the rows and a set of bit lines parallel to the columns. A word line (such as 40, 42) connects the control gate (such as 26) of all transistors in one row. A bit line (such as 50, 52) connects to either the sources or drains of all transistors in one column. The bit lines (such as 50, 52) are paralleled by corresponding conductive strips or metal lines (such as 60, 62). Typically these are aluminum strips overlaid on the bit lines but generally insulated from them by a dielectric layer in between. A series of metal contacts (such as 70, 72) at intervals along a bit line establish contacts with a corresponding metal strip. For example, the contact 70 connects the bit line 50 to the metal line 60. When a transistor or memory cell such as 80 is addressed, appropriate voltages must be passed onto its source and drain via bit lines 50 and 52 respectively, and to its control gate via word line 40. The bit line 50 is connected to metal line 60 via metal contact 70. Similarly, the bit line 52 connecting to the drain of transistor 80 is connected to the metal line 62 via the contact 72. An address bus 90 feeds the row and column address of the cell 80 into a row decoder 92 and a column decoder 94 respectively. The row decoder 92 then connects the control gate voltage $V_{CG}$ to the word line 40 and the column decoder 94 connects the source voltage $V_S$ to the source of the transistor 80 via the metal line 60 and the drain voltage $V_D$ via the metal line 62 to the drain of the transistor 80. In this way any cell in the array can be addressed individually.

Figure 2:
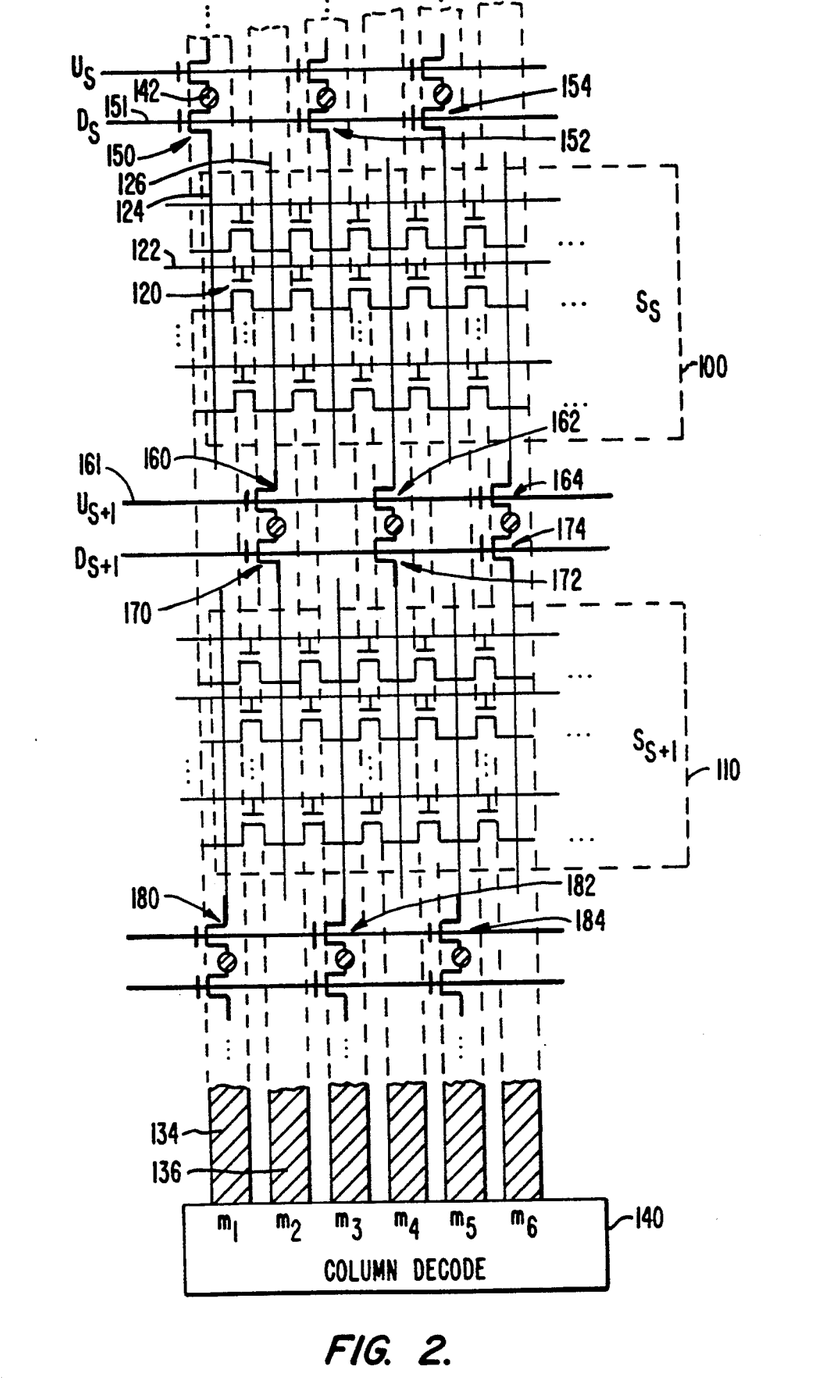
FIG. 2 is a schematic illustration of the architecture according to one preferred embodiment of the present invention.

FIG. 2 illustrates the architecture of a memory device according to one preferred embodiment of the present invention. Instead of having a continuous array of memory cells, the two-dimensional array is partitioned into segmented arrays (such as 100, 110). In one embodiment, each segmented array consists of 16 or 32 rows of cells. For example, a two-dimensional array with a total of 1024 rows may be partitioned into 32 segments each consisting of 32 rows. Thus, along a column, the bit line is also partitioned into 32 independent bit-line segments.

The X-addressing can be done, by row decoding the word lines across the segmented arrays in the two-dimensional array, similar to the conventional case illustrated in FIG. 1. Alternatively, an absolute row address can be given by a segmented array address and a local row address in the segment, and be decoded appropriately. For example, when addressing a cell 120 in column 1 of the segmented array 100, the X-address is given by the address of the segmented array 100 together with the local address of the word line 122. In this case the local address of the word line 122 is the second word line in the segment. The decoding is straight forward and is not shown in FIG. 2 so as not to overburden the illustration.

The Y-addressing must connect the pair of bit lines in an addressed column of an addressed segmented array to the corresponding pair of conductive strip or metal lines. For example, when addressing the cell 120, its pair of bit lines 124, 126 must be connected to a pair of corresponding metal lines, namely 134, 136. The pair of metal lines 134, 136 in turn are connected to a sense amplifier circuit (not shown) via a column decoder 140.

A segment-select transistor 150 is used to selectively connect the segmented bit line 124 to the corresponding metal line 134. The connection is made to the metal line 134 via a metal contact 142. Whenever a logical HIGH signal appears at a select line 151 connected to the control gate of the segment-select transistor 150, the transistor is turned on. Similarly, a HIGH signal appearing at the select line 161 connected to the control gate of a segment-select transistor 160 selectively connects the segmented bit line 126 to the corresponding metal line 136. Thus, when the cell 120 is being addressed, both select lines 151, 161 controlling the cell's source and drain line respectively are pulled HIGH, thereby connecting them to the metal lines 134, 136 respectively.

A novel feature of the invention is that the configuration of the segment-select transistors allows them to have double the pitch of the columns. Therefore the transistors can have double the size compared to one transistor per column, thereby increasing their current capacity and reducing the programming path resistance. This is essential for programmable memory devices such as EPROM or Flash EEPROM, where the drain-source current during programming is one or two orders of magnitude greater than that during reading. Segmentation introduces segment-select transistors which increase the resistance in the programming path through the segment select transistor which causes a potential difference across said transistor and consequent reduction in programming efficiency. The series resistance path during programming is the combination of the two segment-select transistors (one on the drain bit line, one on the source bit line) and the source and drain buried diffusion bit line resistance.

As shown in FIG. 2, the segment-select transistors are located in between segmented arrays. These segment-select transistors are in place of the contacts which would normally be there in a conventional architecture. Referring first to the segmented array 100, segment-select transistors 150, 152, 154, . . . are employed in odd columns from the top, and segment-select transistors 160, 162, 164, . . . are employed in even columns from the bottom. By arranging segment-select transistors every bit line alternately at top and bottom of a segmented array, the pitch of the segment-select transistors is doubled. For example, for a flash EEPROM cell with dimension of $2.6 \times 3.0$ $\mu^2$, the segment-select transistor can have a dimension of $W=4.8\mu$, $L=1.2\mu$ which will favorably offer a sufficiently low resistance connection path.

The introduction of two select transistors every 32 rows adds to the Y dimension of the array (estimate addition of about 2 mils per 1024 rows more than the conventional non-segmented scheme). However, this new approach removes the need to partition the chip into two halves, and therefore eliminates the need to have a second Y decode, which would take about 10 mils in the Y direction. Therefore this segmentation may be added without penalty to the total length of the array.

As described above, the segmented array 100 has segment-select transistors 150, 152, 154, . . . connected to the odd bit lines from above and segment-select transistors 160, 162, 164, . . . connected to the even bit lines from below. However, in order for the segment-select transistors to be in-line with those of the segmented array 100, the configurations of the adjacent segmented arrays are reversed. Thus, the segmented array 110 below the segmented array 100 has segment-select transistors 170, 172, 174, . . . connected to the even bit lines from above and segment-select transistors 180, 182, 184, . . . connected to the odd bit lines from below. Thus the even and odd connection from top and bottom of a segmented array also alternate from one segmented array to the next. In this way, only along alternate bit lines do the segmented bit lines from adjacent arrays share the same metal contact. This results in the metal contacts having a pitch double that of the bit lines.

Figure 3:
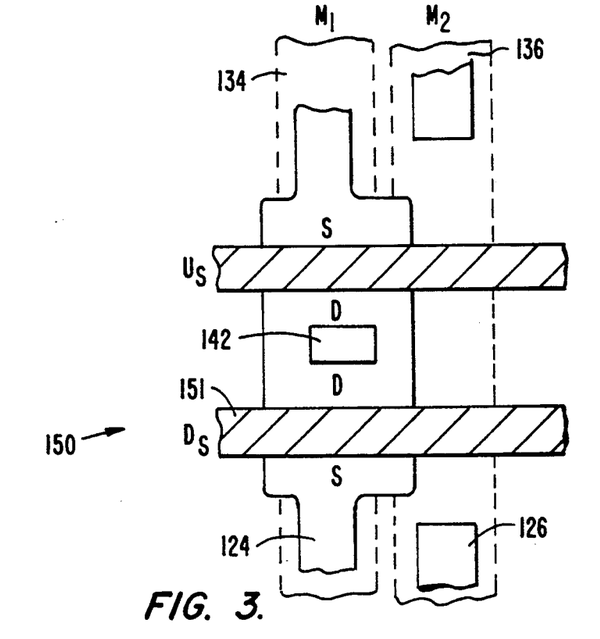
FIG. 3 illustrates a schematic physical layout of the segment select transistor illustrated in FIG. 2.

FIG. 3 is a schematic physical layout of the segment-select transistor such as the transistor 150 illustrated in FIG. 2. The segment-select transistor has its source connected to the bit line 124, and its drain connected to the metal contact 142. Its gate 151 runs horizontal and joins onto that of other segment-select transistors in alternate columns. The metal line 134 overlays the bit line 124, and the adjacent metal line 136 overlays the bit line 126.

There are several other advantages to the segmented architecture of the present invention. For example, by breaking an array with 1026 rows into 32 segmented arrays each consisting of 32 rows, many column-dependent undesirable effects are also significantly reduced by 32 times.

One reduction is in the bit line series resistance. For example, for the flash EEPROM cell with dimension of $2.6 \times 3.0 \mu^2$, the source-drain resistance is equal to about 60Ω per cell. The bit-line resistance for each 32-row segmented array is reduced 32 times compared to a non-segmented array and only ranges from ~100Ω to a maximum of ~2 kΩ. One advantage of this is the possibility of using metal contacts in between segments every 32 rows rather than within the arrays. This makes contacts easier and fewer, thereby increasing reliability. The negative side of this will be more programming sensitivity to location along the 32 rows in a segmented array. Owing to the cumulative series resistance along a bit line, some rows may be slower to program than others. This will limit the maximum number of rows in each segmented array. For example, the worst case diffusion resistance on the drain side for a cell 32 rows away from the nearest segment select transistor is ~2000Ω. This is still within the acceptable range for effective programming.

Similar, column capacitance is also reduced by a factor of 32 (from ~10 pF to ~0.3 pF). The metal line capacitance is also reduced by a factor of 5-10 times, allowing fast sense fast precharge and smaller power spike as a result of charging or discharging bit lines. This will save much power during program column precharge/discharge.

Reduction of column capacitance will also allow EPROM or Flash EEPROM devices to use higher channel implant dose, thereby further increasing programming efficiency. For example, the implant dose may be a boron implant dose in the device substrate in the channel region adjoining the drain diffusion. Its effect is to facilitate hot electron injection into the floating gate from the substrate during programming. However, the capacitance of the device increases rapidly with increasing concentration of boron). Thus, by reducing the metal line capacitance, the flash EEPROM may have inherently higher capacitance without subsequent performance penalty.

The very significant reduction in metal line capacitance results in the flexibility to have arrays with very long columns (up to 8 k to 16 k rows) and very short word lines (512 columns). This helps to reduce word line resistance and capacitance, which also results in wordlines with faster RC time constant. Because of reduced $RC_{word\ line}$ (by 4 times) and reduced $C_{metal\ line}$ (by 2-10 times), access time should be reduced for a 4Mb chip from ~700 ns for 4 quadrants of unsegmented 1 k rows×1 k columns to ~250 ns for a segmented configuration of 2 halves of 4 k rows×5 k columns. The configuration also requires a simpler Y decode, and allows less array partitioning as well as narrow, long chips, which fit into low cost DIP packages.

Segmentation also reduces sensitivity to defects. Any defect located within a segment is isolated to that segment. There is almost no possibility for local latent defects to propagate beyond their segment. Any short between word lines, erase gates, and buried diffusions; bit-line to bit-line shorts, punchthrough, or high background leakage, can be entirely contained to a segment. This enables a system which can remap defective segments to working segments to eliminate otherwise catastrophic column defects.

Other advantages of the segmented architecture are as follows: Bit-line to bit-line leakage is reduced by 32 times and may be tolerable. Program disturb is reduced by 32 times (only one segment at a time is exposed to the bit line drain voltage). Reverse program disturb is greatly reduced because of the series source select transistor.

Alternative Implementation of Column Segmenting

Figure 4:
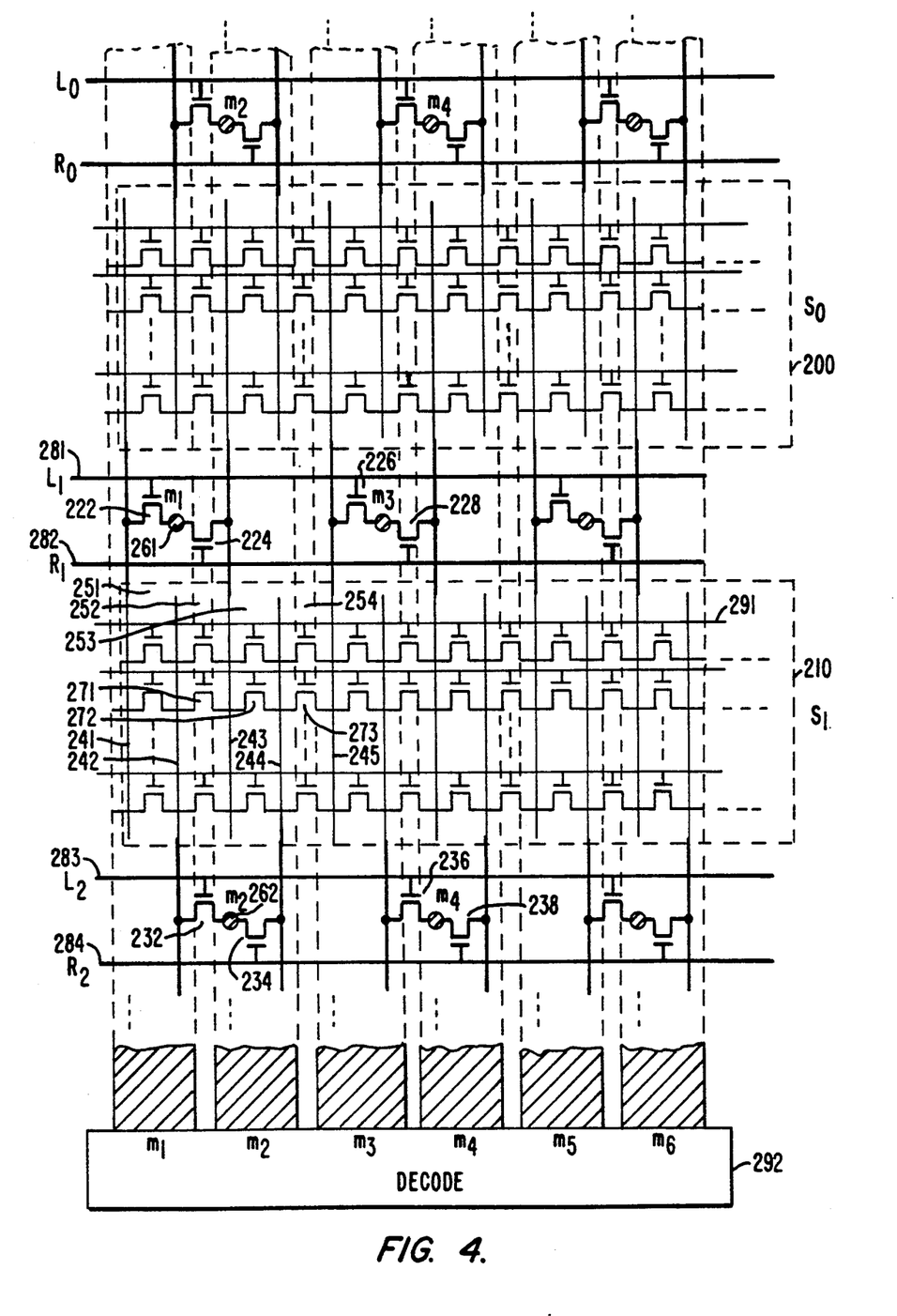
FIG. 4 illustrates the architecture of a memory device according to an alternative preferred embodiment of the present invention.

FIG. 4 illustrates an alternative segmentation in which the segment-select transistors are arranged differently from that of FIG. 2. This architecture has the further advantages of allowing the segment-select transistors to have 4 times the pitch of the bit lines, and the metal lines to have double the pitch of the bit lines.

The partitioning of the array into segmented arrays such as 200, 210 is similar to the scheme illustrated in FIG. 2. Each segmented array preferably consists of 32 or 64 rows of cells. Segment-select transistors (such as 222, 224, 226, 228, . . . ; 232, 234, 236, 238, . . . ) are used to connect a metal line (such as $m_1, m_2, m_3, \ldots$) to the bit lines (such as 241, 242, 243, 244, . . . ) in the columns (such as 251, 252, 253, . . . ). Since the pitch of the metal lines is double that of the bit lines, the first metal line $m_1$ is connectable via a metal contact 261 and segment-select transistors 222, 224 to the bit lines 241, 243. The metal line $m_2$ is connectable via a metal contact 262 and segment-select transistors 232, 234 to the bit lines 242, 244. In other words, each of two adjacent alternate bit lines are served by a single metal line, which is decoded either to the left bit line or to the right bit line. The metal lines $m_1, m_2, \ldots$ are in turned decoded by a metal line decoder 292 and connected to the source and drain voltages.

To program or read any cell (such as 271, 272, 273, ...) in the array the corresponding $L_i$ (such as 281, 283), $R_i$ (such as 282, 284) and $m_i$ lines are used to uniquely access the source and drain bit line diffusions of the segmented array where the cell is located. The $L_i$ and $R_i$ lines are select lines which are respectively connected to the gate of the left and right segment-select transistor. They control whether a metal line is connected to the left or right bit-line. The selected row's word line (such as 291) is then brought high to either read (5 V) or program (12 V) the selected device. For example, in FIG. 4, if the cell 272 is to be addressed, the source line, drain line and word line will respectively be 243, 244 and 291. $L_1$, $L_2$, $R_1$ and $R_2$ are respectively 281, 283, 282 and 284. If the cell 272 is to be programmed to the state "1", the following conditions are applied:

$$V_{source} = 0V; M_1 = 0V, R_1 = 12V, L_1 = 0V$$
$$V_{drain} \approx 8V; M_2 \approx 10V, R_2 = 12V, L_2 = 0V$$
$$V_{CG} = 12V; CG_1 = 12V$$

On the other hand, the cells 271, 273 to the left and right of the cell 272 are not affected. For example, under these conditions, the cell 271 (to the left of the cell 272) has:

$V_{drain} = 0V$, $V_{source}$ = starts floating ($L_2 = 0V$) & then brought to $0V$ through transistor.
$V_{CG1} = 12V$, which causes $V_{source}$ to follow $V_{drain} = 0V$.
The cell 273 (to the right of the cell 272) has:
$V_{source} \approx 10V$
$V_{drain}$ = floating initially ($L_1 = 0V$), and eventually ~ 6-8V
$V_{CG1} = 12V$ Therefore neither the cell 271 nor the cell 273 can be inadvertently programmed.

Figure 5A:
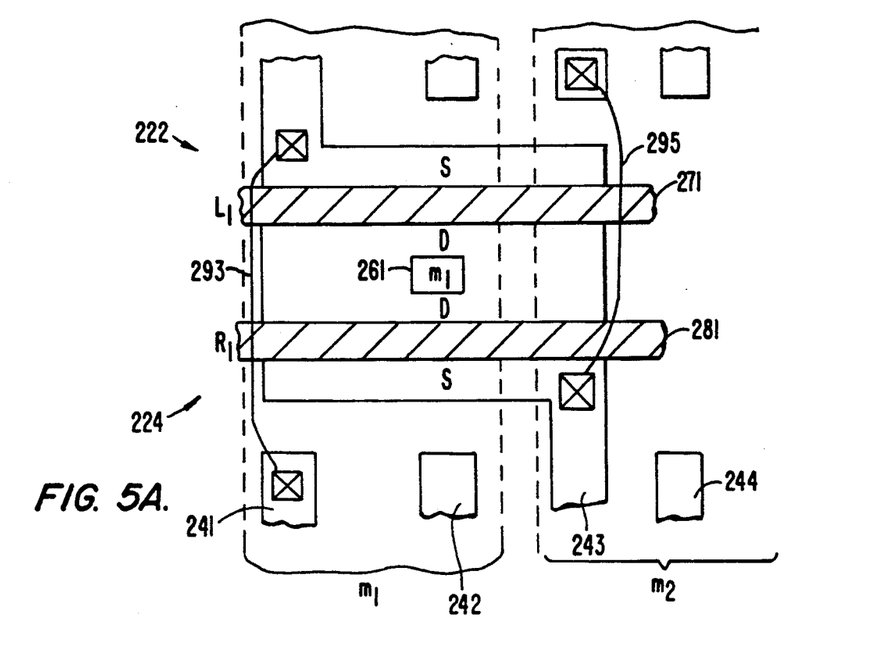
FIG. 5A illustrates a schematic physical layout of the segment select transistor illustrated in FIG. 4.

FIG. 5A illustrates one embodiment of a physical layout of the segment-select transistors 222, 224 shown in FIG. 4. The metal line $m_1$ overlies the bit lines 241, 242, and $m_2$ overlies the bit lines 243, 244. Both transistors 222 and 224 have their drain connected to the metal contact 261. The source of the transistor 222 is connected to the bit line 241 with the aid of a jumper 293 so that the alternate, in-line segmented bit lines of adjacent segmented array (such as 200, 210) are connected. Similarly, the source of the transistor 224 is connected to the bit line 243 which is also linked to the one in the adjacent segmented array with the aid of a jumper 295. The gate 271 of the transistor 222 forms part of the $L_1$ select line which runs horizontally and joins onto the gate of other segment-select transistors. Similar, the gate 281 of the transistor 224 forms part of the $R_1$ select line.

Figure 5B:
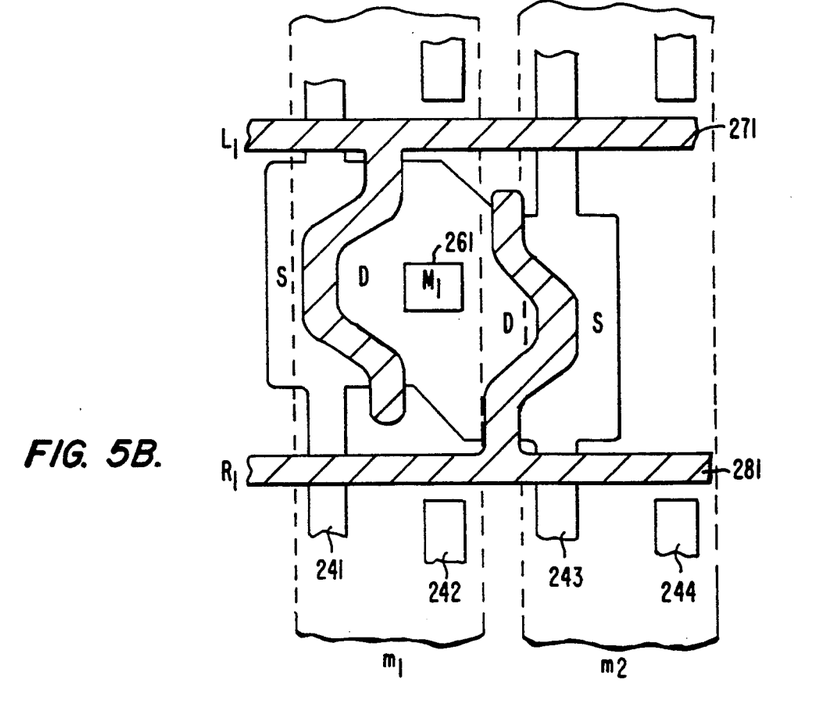
FIG. 5B illustrates another embodiment of the physical layout of the segment select transistor illustrated in FIG. 4.

FIG. 5B shows an alternative layout which does not require jumpers for connecting alternate bit lines between adjacent segmented arrays. The source and drain of the segment select transistors are rotated at right angle relative to that in FIG. 5A.

The architecture of FIGS. 4, 5A and 5B is advantageous over that of FIGS. 2 and 3 in several ways. First is the doubling of the metal line pitch relative to the bit lines. With only one metal line per two bit lines, the metal lines can be made wider and further apart, thereby significantly improving yield. Secondly, the segment-select transistors can be made more than twice as wide. This is because two segment-select transistors fit in the pitch of 4 bit lines compared to that of 2 bit lines in FIGS. 2 and 3. This is especially important for programmable memory devices such as EPROM and Flash EEPROM. The larger segment-select transistor provides low "on resistance" during programming of the selected segment. Third, the number of metal contacts is further reduced to 1 contact per 128 cells (for a 32-row segmented array).

The disadvantages of the architecture of FIGS. 4, 5A and 5B over that of FIGS. 2 and 3 are that the area required for the segment-select transistor is somewhat greater and that the decoding of $L_i$, $R_i$, $m_i$ is somewhat more complex. Since every metal line is now shared by 4 cells (drain, source, drain, source), its decoding is more complicated.

Figure 8:
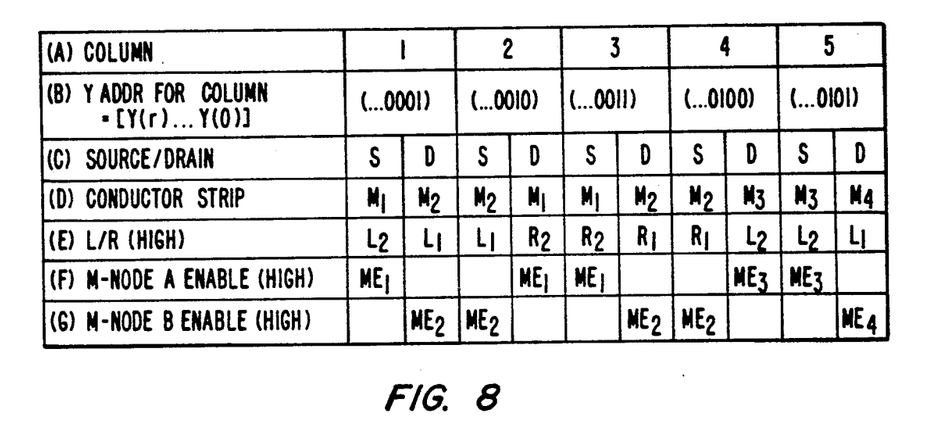
FIG. 8 is a table showing the decoding scheme for an alternative embodiment.

FIG. 8, rows(a)-(g) summarize the decoding scheme for the alternative embodiment. In FIG. 8, row(a), the columns 1, 2, 3, . . . correspond to that labelled by numerals 251, 252, 253, . . . illustrated in FIG. 4. FIG. 8, row(b) shows the binary Y-address assigned to the columns. FIG. 8, row(c) distinguish between the source and drain line for each cell in each column. FIG. 8, row(d) shows the corresponding conductive strip or metal line connectable to the source or drain bit lines. FIG. 8, row(e) lists the select lines which must be selected for the appropriate segment-select transistor.

Figure 6A:
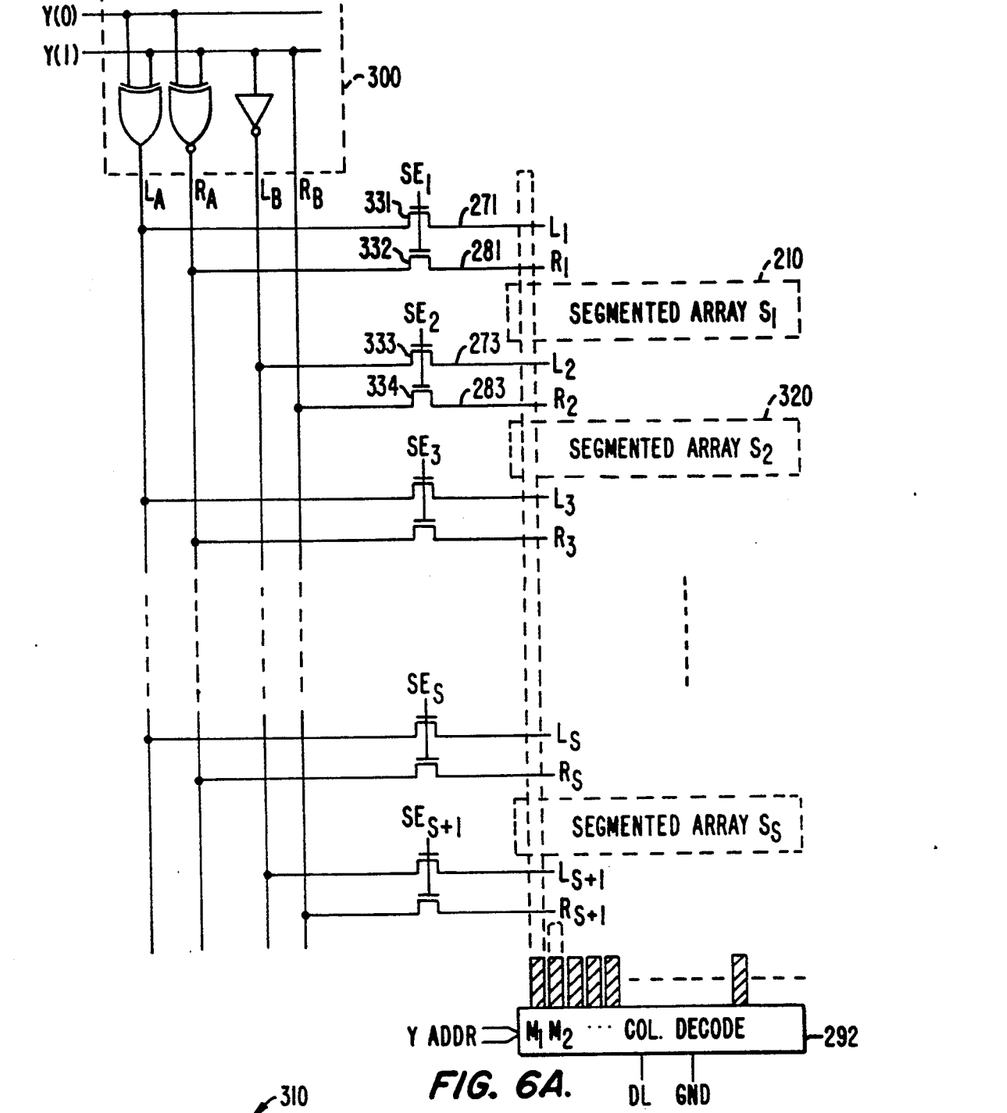
FIG. 6A illustrates the decoding scheme for the alternative embodiment of the present invention.
Figure 9:
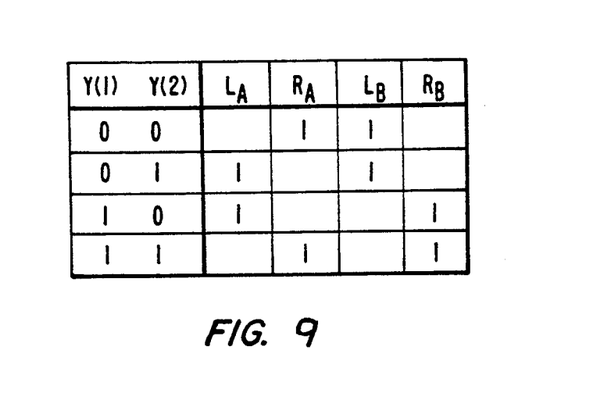
FIG. 9 is a table showing the decoding of Y(0) and Y(1) shown in FIG. 7B.

FIG. 6A illustrates a select-line decoding scheme which will decode according to FIG. 8, row(e). The columns structure illustrated in FIG. 4 exhibits a periodicity of 4. In each period, the four column addresses are encoded by the last two binary digits Y(1), Y(0) of the column address (see FIG. 8, row(b). A decoding circuit 300 takes Y(0), Y(1) as inputs and decodes according to that shown in FIG. 9, which is consistent with the requirements of Table 1(e).

Figure 6B:
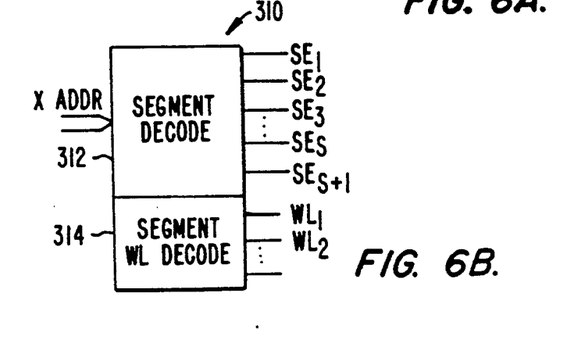
FIG. 6B illustrates schematically a segment decode which selectively enables a given segmented array.

FIG. 6B illustrates an X-decoder 310 which in combination with the scheme of FIG. 6A selectively enable a given segmented array. As discussed earlier, in one embodiment, the X-addressing can be split into addressing each segmented array and addressing the rows therein. The X-decoder 310 can similarly be regarded as comprising a segment decode portion 312 and a segment word line decode portion 314. The segment decode portion 312 has decoded lines such as $SE_1$, $SE_2$, . . . They are used for enabling the corresponding segmented arrays 210, 320, . . . (see FIG. 6A) via enabling transistors 331, 332, 333, 334, . . . . In this way, only the addressed segmented array is enabled.

Figure 7A:
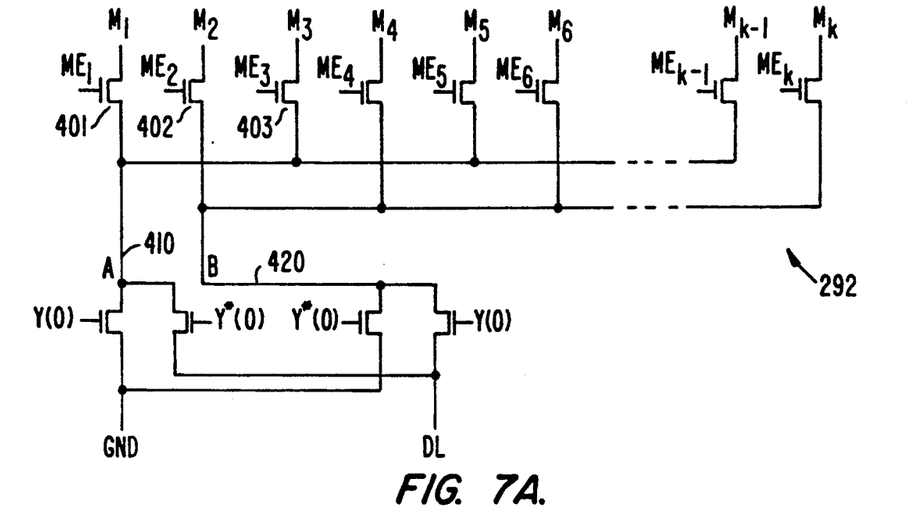
FIG. 7A illustrates a portion of a column decoder which connects a sense amplifier to a selected pair of metal lines.

FIG. 7A illustrates a circuit for the metal line decoder 292 illustrated in FIG. 4. Each of the metal line $m_1, m_2, \ldots$ are connectable via enabling transistors such as 401, 402, 403 to either a node A 410 or a node B 420. The logic of the circuit is such that the node A 410 is connected to a drain voltage, and the node B 420 is connected to ground whenever Y*(0)=1 and vice versa whenever Y(0)=0. In other words, the connections for the nodes A and B are interchanged from one column to another.

Figure 7B:
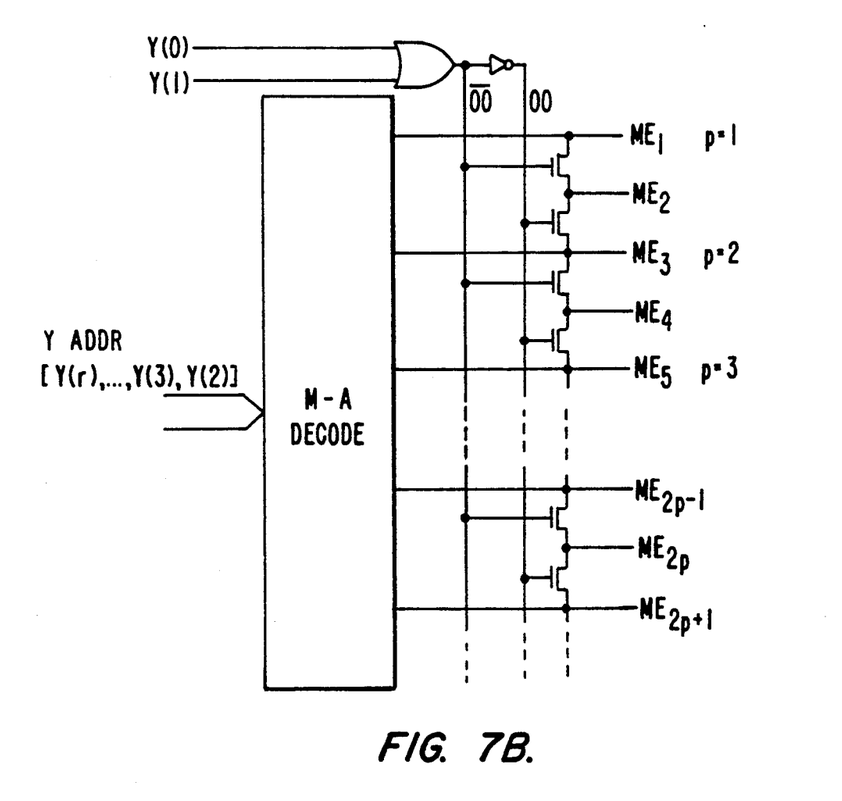
FIG. 7B illustrates another portion of the same column decoder as in FIG. 7A which selectively enables a pair of corresponding metal lines.

FIG. 7B illustrates a circuit for decoding the enabling signals for the metal lines connections of FIG. 7A. Essentially, it ensures the matching of FIG. 8, row(a) with FIG. 8, row(c) and FIG. 8, row(d). The Y-address minus the last two binary digits is used to decode a first set of alternate metal lines (such as $ME_1$, $ME_3$, $ME_5$, . . . ). The last two binary digits of the Y-address Y(0), Y(1)

are used to decode a second set of alternate metal lines (such as $ME_2$, $ME_4$, $ME_6$, ...) from the first set.

The column segmentation approach can be applied with similar advantages to other memory arrays. Specifically it can be used in conjunction with large capacity DRAM memories, where bit line capacitance can be reduced significantly, thereby eliminating the need for local sense amplifiers. It can equally well be employed in high capacity memory arrays of ROM and EEPROM.

While the embodiments of the various aspects of the present invention that have been described are the preferred implementation, those skilled in the art will understand that variations thereof may also be possible. Therefore, the invention is entitled to protection within the full scope of the appended claims.

I claim:

1. In an EPROM or EEPROM of Flash EEPROM integrated circuit memory device, including a two-dimensional array of memory cells organized in rows and columns, each memory cell having a gate, a source and a drain, said two-dimensional array having a word line connected to all the gates in each row, said integrated circuit memory device comprising:

a plurality of segmented arrays formed by partitioning the two-dimensional array along the column direction, each segmented array being formed by a bank of segmented columns and each segmented column having a pair of independent segmented bit lines connected respectively to all the sources and drains therein, such that each segmented array is addressable column-by-column by an array of segmented bit lines;

cell accessing means connectable to an addressed cell in a segmented array by the word line and the pair of segmented bit lines connected thereto, said cell accessing means further comprising:

a plurality of electrically isolated conductive rails parallel to and overlaying the columns of the two-dimensional array, such that for each segmented column therein, the pair of segmented bit lines thereof is associated with a corresponding pair of conductive rails for access therethrough;

first and second switching transistors for exclusively and switchably connecting the pair of segmented bit lines to the pair of corresponding conductive rails;

each first switching transistor located at a top end of each segmented column for switchably connecting first of the pair of segmented bit lines to first of the pair of corresponding conductive rails; and said second switching transistor located at a bottom end of each segmented column for switchably connecting second of the pair of segmented bit lines to second of the pair of corresponding conductive rails;

thereby forming in each segmented array, a row of first switching transistors at a top end thereof one-to-one connected to one set of alternate segmented bit lines therein and a row of second switching transistors at a bottom end thereof one-to-one connected to a complement set of alternate segmented bit lines therein, each said row of first or second switching transistors having a pitch double that of the array of segmented bit lines.

2. An integrated circuit memory device as in claim 1, wherein said cell accessing means further comprises:

a contact pad for each of said first and second switching transistors to connect to a corresponding conductive rail, thereby forming first and second rows of contact pads respectively at the top and bottom ends of each segmented array, and respectively having a pitch equal to that of said row of first or second switching transistors.

3. An integrated circuit memory device as in claim 1, wherein:

each segmented array is a virtual ground memory array wherein along each row thereof the memory cells are serially interconnected by having the drain of one memory cell connected to the source of another memory cell adjacent thereto, such that a segmented bit line connected to all the drains of one segmented column coincides with that connected to all the sources of another segmented column adjacent thereto, and that for each segmented array, the segmented bit lines therein has a pitch equal to that of the bank of segmented columns thereof.

4. An integrated circuit memory device as in claim 3, wherein said cell accessing means further comprises:

a contact pad for each of said first and second switching transistors to connect to a corresponding conductive rail, thereby forming first and second rows of contact pads respectively at the top and bottom ends of each segmented array, and respectively having a pitch equal to that of said row of first or second switching transistors.

5. An integrated circuit memory device as in claim 4, wherein:

said plurality of conductive rails correspond one-to-one to the array of the segmented bit lines in the two-dimensional array, thereby having a pitch equal to that of the array of segmented bit lines.

6. An integrated circuit memory device as in claim 4, said plurality of segmented arrays being arranged along the column direction to form the two-dimensional array, and each segmented array therein having a top end and a bottom end thereof, wherein:

between each pair of adjacent segmented arrays therein, with a first of the pair immediately below a second of the pair, the first row of contact pads at the top end of the first coincides with the second row of contact pads at the bottom end of the second.

7. An integrated circuit memory device as in claim 4, wherein:

said plurality of conductive rails have a pitch double that of the segmented bit lines of a segmented array.

8. An integrated circuit memory device as in claim 7, said plurality of segmented arrays being arranged along the column direction to form the two-dimensional array, such that the segmented bit lines in each segmented array are aligned with that of corresponding segmented bit lines of other segmented arrays in the two-dimensional array, and each segmented array therein having a top end and a bottom end thereof, wherein:

for each cluster of three segmented arrays therein constituted from a lower, middle and upper segmented arrays, the segmented bit lines of the middle segmented array are alternately connected to that of the corresponding segmented bit lines of the upper segmented array and the lower segmented arrays at the second transistor to form a set of straddled segmented bit lines.

9. An integrated circuit memory device as in claim 8, wherein:

said set of straddled segmented bit lines is constituted from first and second sets of interleaving straddled segmented bit lines, said first set of interleaving straddled segmented bit lines being formed by every other straddled segmented bit lines in the full set of straddles segmented bit lines and said second set of interleaving straddles segmented bit lines being formed by the complement of said first set of interleaving segmented bit lines in said full set of straddled segmented bit lines; and said first and second sets of interleaving straddled segmented bit lines being each grouped into pairs, each pair sharing a corresponding conductive rail for the straddled segmented bit lines therein to independently and switchably connectable thereto.

10. In an EPROM or EEPROM of Flash EEPROM integrated circuit memory device, including a two-dimensional array of memory cells organized in rows and columns, each memory cell having a gate, a source and a drain, said two-dimensional array having a word line connected to all the gates in each row, a method of isolating defects that may arise in said array comprising:

partitioning the two-dimensional array along the column direction to form a plurality of segmented arrays, each segmented array being formed by a bank of segmented columns and each segmented column having a pair of independent segmented bit lines connected respectively to all the sources and drains therein, such that each segmented array is addressable column-by-column by an array of segmented bit lines;

selectively connecting a cell accessing means to an addressed cell in a segmented array by the word line and the pair of segmented bit lines connected thereto, said cell accessing means further comprising:

a plurality of electrically isolated conductive rails parallel to and overlaying the columns of the two-dimensional array, such that for each segmented column therein, the pair of segmented bit lines thereof is associated with a corresponding pair of conductive rails for access therethrough;

first and second switching transistors for exclusively and switchably connecting the pair of segmented bit lines to the pair of corresponding conductive rails;

each first switching transistor located at a top end of each segmented column for switchably connecting first of the pair of segmented bit lines to first of the pair of corresponding conductive rails; and each second switching transistor located at a bottom end of each segmented column for switchably connecting second of the pair of segmented bit lines to second of the pair of corresponding conductive rails;

thereby forming in each segmented array, a row of first switching transistors at a top end thereof one-to-one connected to one set of alternate segmented bit lines therein and a row of second switching transistors at a bottom end thereof one-to-one connected to a complement set of alternate segmented bit lines therein, each said row of first or second switching transistors having a pitch double that of the array of segmented bit lines; and said two-dimensional array being segmented that a segmented column therein containing a defect is isolated therein.

11. In an EPROM or EEPROM of Flash EEPROM integrated circuit memory device, including a two-dimensional array of memory cells organized in rows and columns, each memory cell having a gate, a source and a drain, said two-dimensional array having a word line connected to all the gates in each row, a method of reducing capacitance in the source and drain of an adressed memory cell comprising:

partitioning the two-dimensional array along the column direction to form a plurality of segmented arrays, each segmented array being formed by a bank of segmented columns and each segmented column having a pair of independent segmented bit lines connected respectively to al the sources and drains therein, such that each segmented array is addressable column-by-column by an array of segmented bit lines;

selectively connecting a cell accessing means to an addressed cell in a segmented array by the word line and the pair of segmented bit lines connected thereto, said cell accessing means further comprising:

a plurality of electrically isolated conductive rails parallel to and overlaying the columns of the two-dimensional array, such that for each segmented column therein, the pair of segmented bit lines thereof is associated with a corresponding pair of conductive rails for access therethrough;

first and second switching transistors for exclusively and switchably connecting the pair of segmented bit lines to the pair of corresponding conductive rails;

each first switching transistor located at a top end of each segmented column for switchably connecting first of the pair of segmented bit lines to first of the pair of corresponding conductive rails; and each second switching transistor located at a bottom end of each segmented column for switchably connecting second of the pair of segmented bit lines to second of the pair of corresponding conductive rails;

thereby forming in each segmented array, a row of first switching transistors at a top end thereof one-to-one connected to one set of alternate segmented bit lines therein and a row of second switching transistors at a bottom end thereof one-to-one connected to a complement set of alternate segmented bit lines therein, each said row of first or second switching transistors having a pitch double that of the array of segmented bit lines; and said two-dimensional array having segmented arrays with independent segmented bit lines that additional capacitance imparted from other segmented bit lines is avoided.

* * * * *

UNITED STATES PATENT AND TRADEMARK OFFICE
CERTIFICATE OF CORRECTION

PATENT NO. : 5,315,541　　　　　　　　　　　　　　　Page 1 of 2
DATED : May 24, 1994
INVENTOR(S) : Eliyahou Harari, Sanjay Mehrotra It is certified that error appears in the above-indentified patent and that said Letters Patent is hereby corrected as shown below:

In Column 11, line 18 AND In column 13, line 18 AND In Column 14, line 8:
　　　replace "In an EPROM or EEPROM of Flash EEPROM"
　　　with: --In an EPROM or EEPROM or Flash EEPROM--
In Column 11, line 53:
　　　replace "said second switching transistor located at a bottom"
　　　with: --each second switching transistor located at a bottom--
In Column 12, line 62:
　　　replace "constituted from a lower, middle and upper"
　　　with --constituted from lower, middle and upper--
In Column 13, lines 7-9:
　　　replace "every other straddled segmented bit lines in the full set of straddles segmented bit lines and said second set of interleaving straddles segmented bit lines"
　　　with --every other straddled segmented bit line in the full set of straddled segmented bit lines and said second set of interleaving straddled segmented bit lines--

UNITED STATES PATENT AND TRADEMARK OFFICE
CERTIFICATE OF CORRECTION

PATENT NO. : 5,315,541

DATED : May 24, 1994

INVENTOR(S) : Eliyahou Harari, Sanjay Mehrotra

It is certified that error appears in the above-indentified patent and that said Letters Patent is hereby corrected as shown below:

In Column 14, line 5:
    replace "said two-dimensional array being segmented that a"
    with --said two-dimensional array being segmented so that a--
In Column 14, line 15:
    replace "adressed memory cell comprising:"
    with --addressed memory cell comprising:--
In Column 14, line 21:
    replace "lines connected respectively to al the sources and"
    with --lines connected respectively to all the sources and--

Signed and Sealed this

Twenty-fifth Day of October, 1994

Attest:

BRUCE LEHMAN

Attesting Officer     Commissioner of Patents and Trademarks